United States Patent
Cheong et al.

(10) Patent No.: US 10,652,543 B2
(45) Date of Patent: May 12, 2020

(54) EMBEDDED CODEC CIRCUITRY AND METHOD FOR FREQUENCY-DEPENDENT CODING OF TRANSFORM COEFFICIENTS

(71) Applicant: SONY CORPORATION, Tokyo (JP)

(72) Inventors: Hye-Yeon Cheong, San Jose, CA (US); Ali Tabatabai, San Jose, CA (US)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/130,957

(22) Filed: Sep. 13, 2018

(65) Prior Publication Data

US 2020/0092559 A1 Mar. 19, 2020

(51) Int. Cl.
| | |
|---|---|
| *H04N 19/13* | (2014.01) |
| *H04N 19/176* | (2014.01) |
| *H04N 19/91* | (2014.01) |
| *H03M 7/40* | (2006.01) |

(52) U.S. Cl.
CPC .......... *H04N 19/13* (2014.11); *H03M 7/4075* (2013.01); *H04N 19/176* (2014.11); *H04N 19/91* (2014.11)

(58) Field of Classification Search
CPC .... H04N 19/103; H04N 19/119; H04N 19/12; H04N 19/13; H04N 19/134; H04N 19/136
USPC ............. 375/240.02, 240.03, 240.1, 240.23, 375/240.24
See application file for complete search history.

(56) References Cited

U.S. PATENT DOCUMENTS

| | | | |
|---|---|---|---|
| 2010/0322305 A1 | 12/2010 | Crandall et al. | |
| 2011/0228856 A1* | 9/2011 | Bjoentegaard | H04N 19/176 375/240.24 |
| 2013/0266060 A1 | 10/2013 | Budagavi et al. | |
| 2015/0201220 A1 | 7/2015 | Cheong et al. | |

FOREIGN PATENT DOCUMENTS

| | | |
|---|---|---|
| WO | 2009/044346 A1 | 4/2009 |
| WO | 2012/025215 A1 | 3/2012 |

* cited by examiner

*Primary Examiner* — Dominic D Saltarelli
(74) *Attorney, Agent, or Firm* — Chip Law Group

(57) ABSTRACT

Embedded codec (EBC) circuitry for frequency-dependent coding of transform coefficients, groups a plurality of transform coefficients for an input image block into a plurality of groups of transform coefficients. The plurality of transform coefficients are grouped based on a frequency distribution of the plurality of transform coefficients for the input image block. The EBC circuitry selects a different entropy coding parameter from a set of entropy coding parameters for each group of the plurality of groups, based on the frequency distribution. Thereafter, the EBC circuitry applies an entropy coding scheme from a set of entropy coding schemes to each group of transform coefficients, in accordance with the selected entropy coding parameter.

20 Claims, 8 Drawing Sheets

500B

| Type 0 | | | Type 1 | | | Type 2 | | |
|---|---|---|---|---|---|---|---|---|
| Input | Code Length | Example Code | Input | Code Length | Example Code | Input | Code Length | Example Code |
| -10 | 12 | 000000000110 | -10 | 10 | 0000000110 | -10 | 7 | 0000110 |
| -9 | 11 | 00000000111 | -9 | 9 | 000000111 | -9 | 7 | 0000111 |
| -8 | 11 | 00000000110 | -8 | 9 | 000000110 | -8 | 6 | 000110 |
| -7 | 10 | 0000000111 | -7 | 8 | 00000111 | -7 | 6 | 000111 |
| -6 | 10 | 0000000110 | -6 | 8 | 00000110 | -6 | 5 | 00110 |
| -5 | 8 | 00000011 | -5 | 7 | 0000111 | -5 | 5 | 00111 |
| -4 | 7 | 0000011 | -4 | 7 | 0000110 | -4 | 4 | 0110 |
| -3 | 6 | 000011 | -3 | 5 | 00011 | -3 | 4 | 0111 |
| -2 | 5 | 00011 | -2 | 4 | 0011 | -2 | 3 | 110 |
| -1 | 3 | 001 | -1 | 3 | 011 | -1 | 3 | 111 |
| 0 | 1 | 1 | 0 | 2 | 11 | 0 | 3 | 110 |
| 1 | 2 | 01 | 1 | 2 | 10 | 1 | 3 | 100 |
| 2 | 5 | 00010 | 2 | 3 | 010 | 2 | 3 | 101 |
| 3 | 6 | 000010 | 3 | 4 | 0010 | 3 | 4 | 0100 |
| 4 | 7 | 0000010 | 4 | 5 | 00010 | 4 | 4 | 0101 |
| 5 | 8 | 00000010 | 5 | 7 | 0000100 | 5 | 5 | 00100 |
| 6 | 10 | 0000000100 | 6 | 7 | 0000101 | 6 | 5 | 00101 |
| 7 | 10 | 0000000101 | 7 | 8 | 00000100 | 7 | 6 | 000100 |
| 8 | 11 | 00000000100 | 8 | 8 | 00000101 | 8 | 6 | 000101 |
| 9 | 11 | 00000000101 | 9 | 9 | 000000100 | 9 | 7 | 0000100 |
| 10 | 12 | 000000000100 | 10 | 9 | 000000101 | 10 | 8 | 0000101 |

FIG. 5B

EMBEDDED CODEC CIRCUITRY AND METHOD FOR FREQUENCY-DEPENDENT CODING OF TRANSFORM COEFFICIENTS

CROSS-REFERENCE TO RELATED APPLICATIONS/INCORPORATION BY REFERENCE

None.

FIELD

Various embodiments of the disclosure relate to image and video compression and decompression technology in embedded codec circuitry. More specifically, various embodiments of the disclosure relate to embedded codec circuitry for frequency-dependent coding of transform coefficients.

BACKGROUND

Recent advancements in the field of image compression have led to the development of various embedded image codecs for encoding and decoding digital data, such as images and/or videos. Typically, an encoder in a device, such as a camera, may compress a raw image captured by communicatively coupled image-capturing unit. The encoder may utilize various lossless or lossy image compression techniques, such as transform coding and/or entropy encoding, to encode the captured raw image and generate a bit-stream. In transform coding, pixel data from an image block is transformed to frequency domain represented by transform coefficients. The remaining information, such as the transform coefficients, may then be compressed via a variety of methods. The generated bit-stream may be transmitted to a decoder, which may decompress the received bit-stream to reproduce the captured image. In view of the increased popularity of high definition image or video, it is increasingly critical to develop advanced image compression techniques that may make possible high compression and still exemplify low hardware complexity and latency. Therefore, a low latency and low complexity system and method may be desired to efficiently encode transform coefficients with visually lossless results.

Further limitations and disadvantages of conventional and traditional approaches will become apparent to one of skill in the art, through comparison of described systems with some aspects of the present disclosure, as set forth in the remainder of the present application and with reference to the drawings.

SUMMARY

Embedded Codec (EBC) circuitry and method for frequency-dependent coding of transform coefficients is provided substantially as shown in, and/or described in connection with, at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

FIG. 5B illustrates a coding table where different groups of transform coefficients are entropy coded in accordance with a different entropy coding parameter, in accordance with an embodiment of the disclosure.

DETAILED DESCRIPTION

Various embodiments of the present disclosure may be found in a method and embedded codec (EBC) circuitry for frequency-dependent coding of transform coefficients. The EBC circuitry may include a memory and an encoder circuitry that may handle generation of encoded bit-stream of an input image block. The disclosed EBC circuitry implements a simple but high performance entropy coding method for transform coefficients. The proposed method allows a low complexity, a sample-independent or a parallel computing capability for entropy coding of transform coefficients that may be grouped into different groups based on a frequency distribution of transform coefficients in an input block. By adaptively coding different groups as per a particular frequency distribution, adverse effect of several compression artifacts (e.g., block artifacts) may be reduced when the bit-stream of encoded input Image blocks is reconstructed to generate an input image. Also, by reduction of several compression artifacts, the average PSNR of the input image adaptively increases as compared to that for conventional entropy coding schemes, such as the exponential-Golomb coding scheme. By creating different groups in an input block of transform coefficients and selection of optimal entropy coding parameter (e.g., a PGC parameter) for every group, an optimal bit allocation may be achieved as per a target bit-budget for the input image block, which may also result in an improvement in the compression factor.

Figure 1:
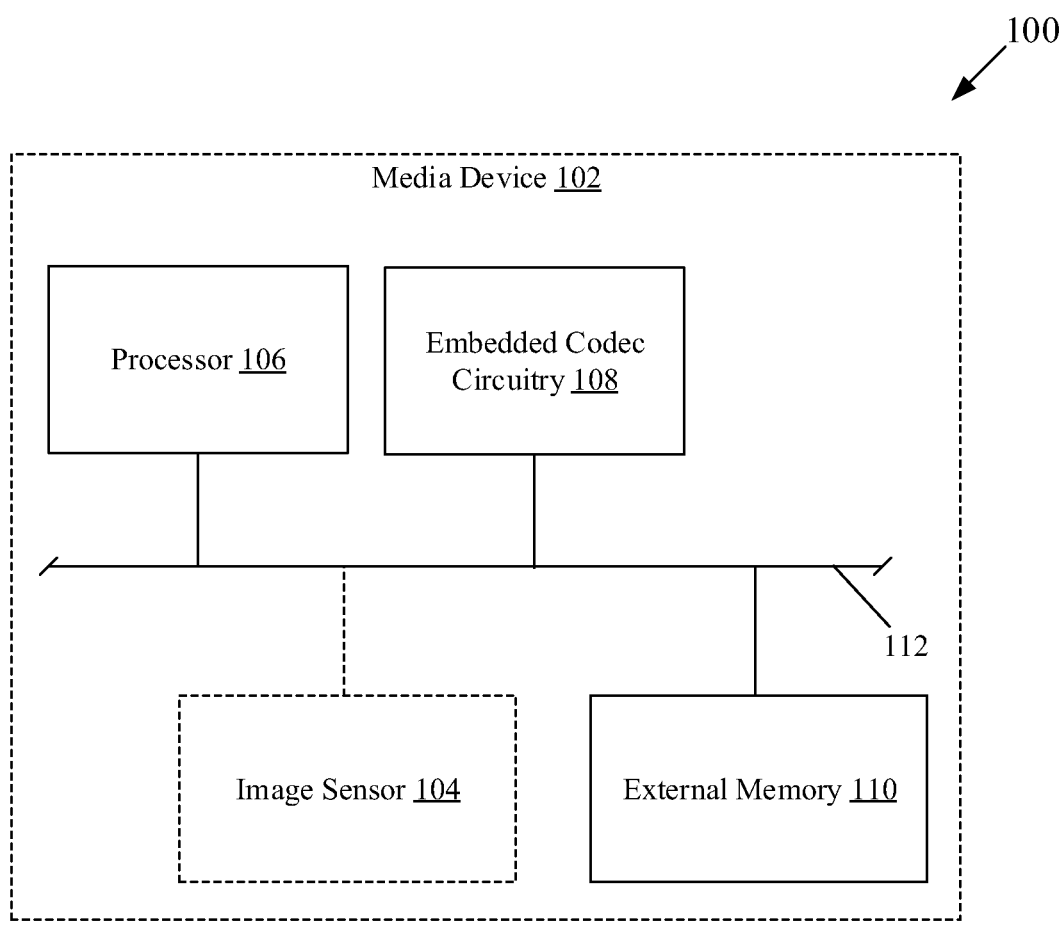
FIG. 1 is a block diagram that illustrates an exemplary media device with an embedded codec (EBC) circuitry and other circuitries for frequency-dependent coding of transform coefficients, in accordance with an embodiment of the disclosure.

FIG. 1 is a block diagram that illustrates an exemplary media device with an embedded codec (EBC) circuitry and other circuitries for frequency-dependent coding of transform coefficients, in accordance with an embodiment of the disclosure. With reference to FIG. 1, there is shown a media device 102 that includes a processor 106, an embedded codec (EBC) circuitry 108, and an external memory 110. In some embodiments, an image sensor 104 may be interfaced with the processor 106, the EBC circuitry 108, and the external memory 110. There is further shown a system bus 112 that interconnects the image sensor 104, the processor 106, the EBC circuitry 108, and the external memory 110.

The media device 102 may comprise suitable logic, circuitry, and interfaces that may be configured to store uncompressed raw images and/or videos as encoded (i.e. compressed) images and/or videos in the external memory 110. The media device 102 may be further configured to manage encoding as well as decoding of media content (for example, encoded images and/or videos) and further playback of the decoded media content at the media device 102. The media device 102 may include a dedicated on-chip codec circuitry (such as the EBC circuitry 108), and the external memory 110 for storage of images (raw uncompressed or encoded), along with other computational circuitries for an offline (without network) encoding of the media content at the media device 102. In some embodiments, the media device 102 may also include one or more image sensors (such as the image sensor 104) to capture images in a raw image file format, which is an uncompressed file format. In such cases, the captured image may be encoded by the EBC circuitry 108 of the media device 102. Examples of the media device 102 may include, but are not limited to, a digital camera, a portable communication device (e.g. laptops, smartphones, tablets, phablets, smart watches, smart glasses, etc.), a media server, a workstation, a desktop computer, and augmented reality/Virtual Reality/Mixed Reality (AR/VR/MR) devices.

Although not shown in FIG. 1, the media device 102 may also include a network interface that may be configured to manage sharing of encoded and/or raw uncompressed images and/or videos with other peripheral or peer-connected devices, through a communication network (also not shown). The detailed description of the network interface and the communication network has been omitted from the present disclosure for the sake of brevity.

The image sensor 104 may comprise suitable logic, circuitry, and interfaces that may be configured to capture a raw uncompressed image or a sequence of raw uncompressed images of a scene in a field-of-view (FOV) of the image sensor 104. The image sensor 104 may be implemented as an active pixel sensor, such as a complementary-metal-oxide semiconductor (CMOS) sensor. In such implementation, the image sensor 104 may be configured to execute progressive scan (line-by-line) of each row or column of pixels (one dimensional (1D) pixel-array or 1D image block) on a sensor core of the CMOS sensor. The progressive scan may be a vertical scan (column wise) or a horizontal scan (row wise). In some embodiments, instead of an active pixel sensor, the image sensor 104 may be implemented as one of a passive pixel sensor (such as a charged coupled device (CCD) sensor, an oversampled binary image sensor, a planar Fourier capture array (PFCA), a back-illuminated (BSI or BI) sensor, and the like. Although not shown, the image sensor 104 may also include a specialized microprocessor (or a microcontroller) that may be configured to operate in accordance with image data from the image sensor 104, a graphic processing unit (GPU) to process images stored in a frame buffer, and/or a memory integrated with the image sensor 104.

The processor 106 may comprise suitable logic, circuitry, and interfaces that may be configured to execute a set of instructions stored in a dedicated memory (e.g., the external memory 110 or an on-chip memory in the EBC circuitry 108). The processor 106 may be implemented based on a number of processor technologies known in the art. Examples of the processor 106 may include, but are not limited to, a Graphical Processing Unit (GPU), a co-processor (such as a specialized image co-processor) for a processor, a specialized digital signal processor, a Central Processing Unit (CPU), an x86-based processor, an x64-based processor, a Reduced Instruction Set Computing (RISC) processor, an Application-Specific Integrated Circuit (ASIC) processor, a Complex Instruction Set Computing (CISC) processor.

The EBC circuitry 108 may comprise suitable logic, circuitry, and interfaces that may be configured to encode an input image block (e.g., an "8×4" input image block) as per a specific compression factor and further decode the encoded input image block, in response to instructions received at the EBC circuitry 108. The input image block may be part of an input image (i.e. a raw uncompressed image) or a pixel array (row or column) retrieved directly from a read out register of the image sensor 104, following a row-wise or a column-wise scan by the image sensor 104. The EBC circuitry 108 may further manage storage of a bit-stream of encoded input image block in the external memory 110 or may manage transfer of the bit-stream of encoded input image block to other media devices, via dedicated communication networks.

The EBC circuitry 108 may be implemented as a specialized hardware encoder/decoder interfaced with the other computational circuitries of the media device 102. In such implementations, the EBC circuitry 108 may be associated with a specific form factor on a specific computational circuitry. Examples of the specific computational circuitry may include, but are not limited to, a field programmable gate array (FPGA), programmable logic devices (PLDs), an application specific integrated circuit (ASIC), a programmable ASIC (PL-ASIC), application specific integrated parts (ASSPs), and a System-on-Chip (SOC) based on standard microprocessors (MPUs) or digital signal processors (DSPs). In accordance with another embodiment, the EBC circuitry 108 may be also interfaced with a graphical processing unit (GPU) to parallelize operations of the EBC circuitry 108. In accordance with yet another embodiment, the EBC circuitry 108 may be implemented as a combination of programmable instructions stored in a memory and logical units (or programmable logic units) on a hardware circuitry of the media device 102.

The external memory 110 may comprise suitable logic, circuitry, and interfaces that may be configured to store one or more input image blocks of an input image (uncompressed raw or encoded) or a sequence of input images. The external memory 110 may be further configured to act as an image buffer to store raw uncompressed 1D image blocks retrieved directly from the image sensor 104. Additionally, the external memory 110 may store instructions associated with sequential encoding/decoding schemes that may be selectively applied, by the EBC circuitry 108, to generate a bit-stream of encoded input image block. In an exemplary embodiment, the external memory 110 may be dynamic random access memory (DRAM) circuits that may be externally interfaced with the EBC circuitry 108. In another exemplary embodiment, the external memory 110 may be static random access memory (SRAM) circuits that may be externally interfaced with the EBC circuitry 108. Further examples of implementation of the external memory 110 may include, but are not limited to, Random Access Memory (RAM), Read Only Memory (ROM), Electrically Erasable Programmable Read-Only Memory (EEPROM), Hard Disk Drive (HDD), a Solid-State Drive (SSD), a CPU cache, or a Secure Digital (SD) card.

Although not shown in FIG. 1, the media device 102 may further include a video codec that may be implemented by known codec standards that may include Advanced Video Codec (AVC)/Media Experts Group (MPEG-4/AVC) or H.264, MPEG-4/HEVC or H.265, and the like. Additionally, the video codec may be supported by other codec libraries that may include FFmpeg, Xvid, DIVx, VP1-9, Windows Media Codec, FFavs, and the like.

The system bus 112 may be a hardware bus that may include a set of data channels (or conductive paths) to different components of the media device 102. Alternatively stated, the system bus 112 may interconnect at least data ports, address ports, and control signal ports of different components of the media device 102. For example, the system bus 112 may interconnect the image sensor 104, the processor 106, the EBC circuitry 108, the external memory 110, and other circuitries to each other. The system bus 112 may be configured to facilitate a serial data communication or a parallelized data communication between different components on-board the media device 102. Examples of the system bus 112 may include an 8-bit parallel single system bus, a 16-bit parallel single system bus, a 32-bit parallel single system bus, a 64-bit parallel single system bus, a serial data bus, and the like.

In operation, an input image block or a sequence of input image blocks may be received by the media device 102. In some embodiments, the input image block or the sequence of input image blocks may be retrieved directly from a read-out register of an on-chip image sensor (such as the image sensor 104) or a camera device interfaced with the media device 102. In other embodiments, the input image block or the sequence of input image blocks may be retrieved from an uncompressed raw input image stored in a persistent storage of the media device 102 or received externally from other media storage devices, such as cameras, data servers, etc.

The EBC circuitry 108 may be configured to receive the input image block or the sequence of input image blocks from the external memory 110 or directly from the read out register of the image sensor 104. The EBC circuitry 108 may be configured to execute a sequential encoding scheme on the input image block to generate a bit-stream of encoded input image block. The bit-stream of encoded input image block may include header information that may indicate the sequential encoding scheme applied at an encoding stage of the input image block, to obtain the bit-stream of encoded input image block. In the sequential encoding scheme, different variations in a sequence and number of encoding stages are possible, some of which are briefly mentioned herein. In accordance with an embodiment, the sequential encoding scheme may include, in a sequence, a transform stage, a quantization stage, a prediction stage, and an entropy coding stage. In accordance with another embodiment, the sequential encoding scheme may include only the transform stage, the quantization stage, and the entropy coding stage, without a need for a prediction stage. In accordance with yet another embodiment, the sequential encoding stage may include a prediction stage, a transform stage, a quantization stage, and an entropy coding stage. Here, the prediction stage occurs before the transform stage of the sequential encoding scheme.

In accordance with an embodiment, the EBC circuitry 108 may be configured to receive an input image and partition the received input image into a plurality of image blocks, for example, a plurality of "8×4" input image blocks. The plurality of image blocks may correspond to a logical partition of the input image.

The EBC circuitry 108 may be further configured to apply a transform coding scheme on an input image block to generate an input block of transform coefficients. In accordance with an embodiment, the transform coding scheme may correspond to one of: a one dimensional (1D) row discrete cosine transform (DCT) or a 1D column DCT. In accordance with an embodiment, the transform coding scheme may correspond to a two dimensional (2D) DCT. In accordance with an embodiment, the transform coding scheme may be based on a family of sinusoidal unitary transforms (that includes a family of orthonormal bases or eigenvectors). Examples of the forward transforms in the transform coding scheme may include, but are not limited to, type I-VIII Discrete Cosine Transform (DCT), type I-VIII Discrete Sine Transform (DST), Discrete Wavelet Transform (DWT), and a Dual-Tree Complex Wavelet Transform (DCWT). For example, an "8×1" 1D row DCT transform may be applied on each row of an "8×4" input image block of a "1280×720" input image. Alternatively, a "1×4" 1D column DCT transform may be applied on each column of the "8×4" input image block. The size of the transform applied on the input image block may depend on a size of the input image block. The size of the input image block may be specified prior to the encoding of the input image block.

In accordance with an embodiment, the EBC circuitry 108 may be further configured to quantize the plurality of transform coefficients in the input block to generate an input block of a plurality of quantized-transformed levels. The plurality of quantized-transformed levels may be separated from each other by a plurality of discretized quantization bins. A step size for the plurality of quantization bins may be further selected adaptively or uniformly to efficiently quantize the input block of transform coefficients into a plurality of quantized-transformed levels. Each quantized-transformed level may be a mid-value from an upper bound and a lower bound of a quantization bin, for example, a quantization bin of "(155,175)" may include a quantized-transformed level of "(155+175)/2", i.e. "165". With quantization, the EBC circuitry 108 may remove redundant coefficient information from transform domain data (i.e. the plurality of transform coefficients for the input block) without a visually noticeable degradation of quality.

The plurality of quantization bins may be determined based on a quantization parameter (QP), which may vary with a defined rate in accordance with an adaptive quantization scheme to encode or decode the media content. The QP may vary from 0 to a bit depth of a bit-stream of encoded input image block. For example, a QP for an 8-bit bit-stream of compressed input image block may be selected as "7" for a first portion of transform coefficients and "0" for a second portion of transform coefficients of the input block, which may indicate that the first portion of transform coefficients may be quantized with a finer step size as compared to the second portion and the second portion may not be quantized at all.

In accordance with an embodiment, the EBC circuitry 108 may be further configured to apply a residual prediction scheme on the input block of quantized-transformed levels. After application of the residual prediction scheme, an input block of quantized-transformed residual levels may be obtained from the input block of quantized-transformed levels. Examples of the residual prediction scheme may include, but are not limited to, a Pulse Coded Modulation (PCM) scheme, a Differential Pulse Code Modulation (DPCM) scheme, or an Adaptive DPCM (ADPCM) scheme. In DPCM and ADPCM schemes, instead of utilizing each quantized-transformed level, a residue is predicted from reference quantization levels.

The input block, for example, a "8×4" input block, may include a plurality of transform coefficients, which may be further include into a DC transform coefficient and a plurality of AC transform coefficients. Here, "DC" represents direct current (DC) term which is a first term in the input block, and thus exhibits a zero frequency and remaining elements are known as alternative current (AC) terms (also referred to as AC values or coefficients) that exhibit a non-zero frequency. The EBC circuitry 108 may be configured to determine a frequency distribution of the plurality of transform coefficients in the input block for the input image block. The frequency distribution may correspond to a histogram distribution, where different bins (that represent different ranges of coefficient values) of transform coefficients in the input block may indicate a number of transform coefficients.

Figure 4A:
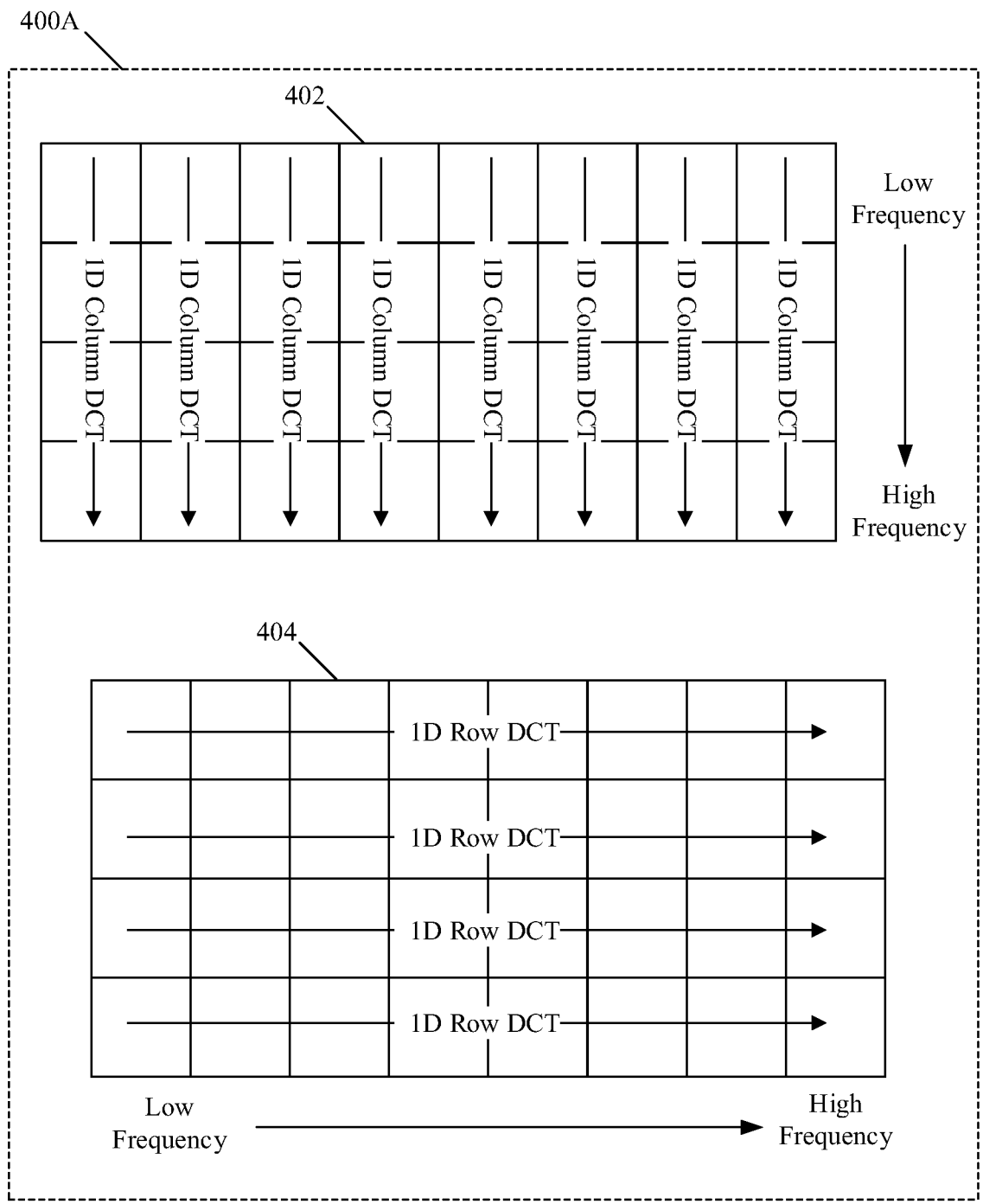
FIG. 4A illustrates variations in application of different transform coding schemes for an input image block, in accordance with an embodiment of the disclosure.
Figure 4B:
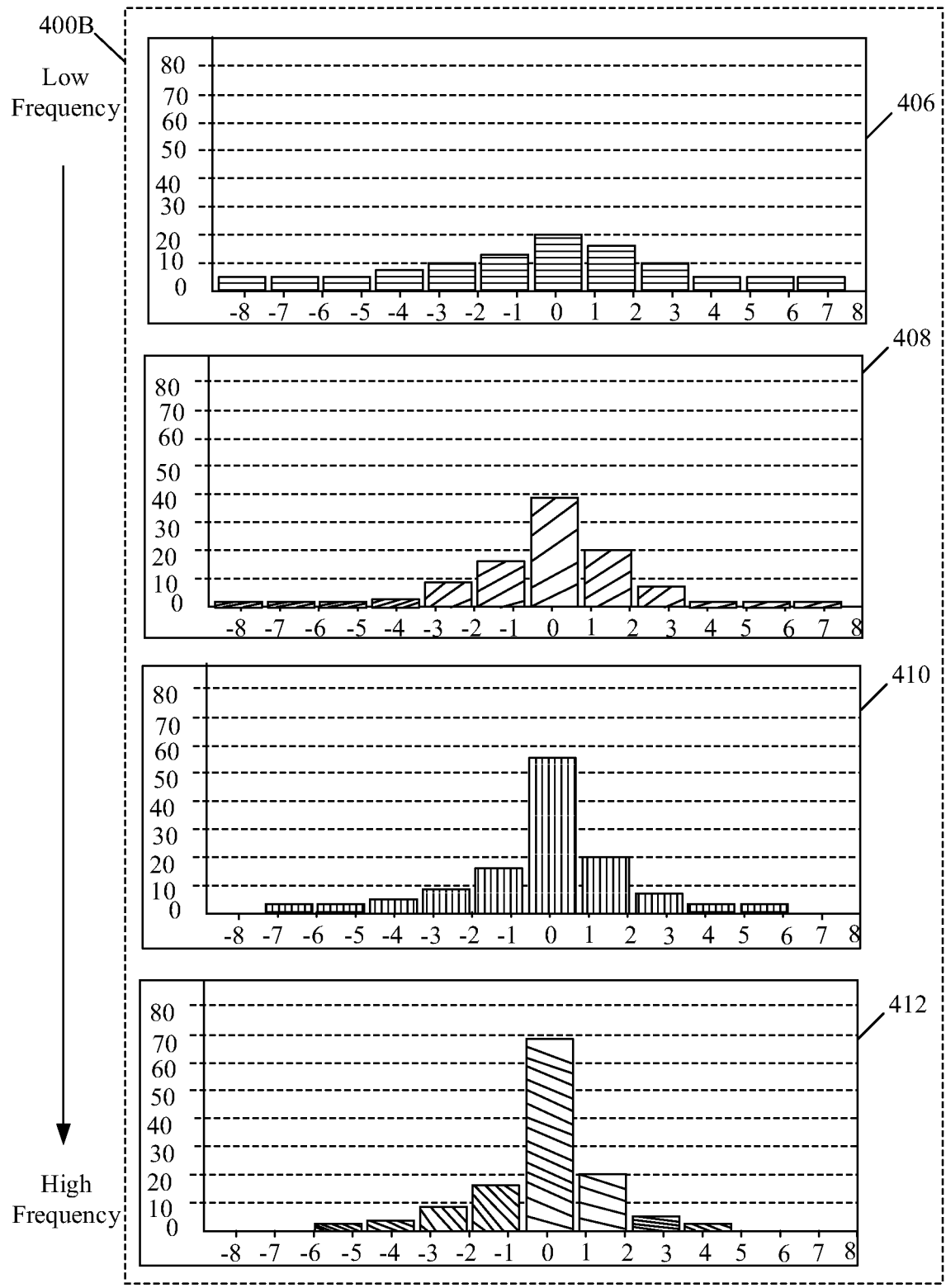
FIG. 4B illustrates frequency distribution of high frequency and low frequency coefficients in a block of transform coefficients, in accordance with an embodiment of the disclosure.

For example, in an event that 1D row DCT is applied on the input image block, frequency of transform coefficients on the right end of the rows may be high, such as large concentration of "−1, 0, and 1" coefficient values towards the right side. On the other hand, frequency of transform coefficients on the left end of the rows of the input block may be low. In a second example, in an event that 1D column DCT is applied on the input image block, frequency of transform coefficients on the top end of the columns low. On the other hand, frequency of transform coefficients on the bottom end of the rows of the input block may be high, as shown in FIGS. 4A and 4B.

The EBC circuitry 108 may be further configured to group the plurality of transform coefficients (of the input block) for an input image block into a plurality of groups of transform coefficients. The plurality of transform coefficients may be grouped, based on the frequency distribution of the plurality of transform coefficients for the input image block. Similar transform coefficients may be grouped into a same group of the plurality of groups. It is observed that the distribution of transform coefficients is frequency/position dependent. This observation may be utilized to decide grouping positions of the transform coefficients in an input block to group as per an implemented transform scheme. An example to illustrate that distribution of transform coefficients is frequency/position dependent is shown and described in FIGS. 4A and 4B.

The EBC circuitry 108 may be further configured to select a different entropy coding parameter from a set of entropy coding parameters for each group of the plurality of groups, based on the frequency distribution. Different entropy coding parameters in the set of entropy coding parameters may specify a maximum code length for a particular group in the plurality of groups.

The EBC circuitry 108 may be further configured to apply an entropy coding scheme (e.g., a Progressive Golomb Coding (PGC) Scheme) from a set of entropy coding schemes to each group of transform coefficients, in accordance with the selected entropy coding parameter. For example, the entropy coding scheme that may be applied to each group may be a Golomb-M coding scheme, where "M" represents a tunable parameter that may correspond to the selected entropy coding parameter for a particular group. The transform coefficients in the input block may be grouped into 3 different groups, where transform coefficients in the first group may be entropy coded with M=1, i.e. unary codes, transform coefficients in the second group may be entropy coded with M=2 or 3. Similarly, the transform coefficients in the third group may be entropy coded with other values of M.

The set of entropy coding schemes may include, but are not limited to, a Huffman coding scheme, an exponential-Golomb coding scheme, a Golomb-Rice coding scheme, an arithmetic coding scheme, a Lempel-Ziv-Welch coding scheme, and the PGC scheme. The EBC circuitry 108 may be further configured to generate a bit-stream of encoded image block by application of the entropy coding scheme. The bit-stream may include equivalent codes of transform coefficients in the input block that run up to a specific code length per group.

In accordance with an embodiment, an EBC decoder circuitry (not shown in FIG. 1) of the EBC circuitry 108 may be configured to pre-store different coding tables (e.g., custom coding tables for Huffman encoding schemes, Exponential-Golomb encoding schemes) and quantization tables. Therefore, the bit-stream of encoded image block may need not include different coding tables and quantization tables. In accordance with an embodiment, the EBC circuitry 108 may be configured to generate the bit-stream of encoded image block such that the bit-stream may be decodable by different external decoders that may utilize different decoding schemes to decode the bit-stream of encoded image block. In such a case, the EBC circuitry 108 may be configured to add different coding tables (e.g., custom coding tables for Huffman encoding schemes, Exponential-Golomb encoding schemes, or signaling bit tables) and quantization tables, in header information or a different meta-stream associated with the bit-stream of encoded image block. By addition of such custom tables and quantization tables in the bit-stream, the output of the EBC circuitry 108 may be decodable by other decoder circuitries.

In accordance with an embodiment, the bit-stream of encoded image block may be stored as part of an input image (such as, a 2D image) in the memory, such as the external memory 110 or an on-chip memory in the EBC circuitry 108. The bit-stream of encoded 1D image block may have multiple implementations in different applications. Some of the implementations have been briefly presented herein. In one implementation, the processor 106 may be configured to transfer the bit-stream of encoded image block, via the system bus 112, to a frame buffer (or a frame store) of a display circuitry (e.g., a video card) communicatively interfaced with the system bus 112 of the media device 102. The frame buffer may act as a compressed frame buffer for the display circuitry. The display circuitry (not shown in FIG. 1) may decode and further utilize the bit-stream of encoded bit-stream of image block to display a patch of image onto a display screen of the media device 102. In another implementation, the processor 106 may be configured to transfer the bit-stream of encoded image block, via the system bus 112, to a decoder buffer, such as a decoder picture buffer (DPB) of a video decoder, a buffer memory for an image decoder, or a coded picture buffer (CPB) of a video codec, in the media device 102.

In an exemplary implementation, the media device 102 may be a camera, such as a digital video camera or a digital image camera, and the bit-stream of encoded image block may correspond to a 2D array of pixel values that are directly received from a read-out register of a CMOS sensor in the camera. In a specific scenario, the EBC circuitry 108 may be implemented in the CMOS sensor circuitry. The detailed operation of EBC circuitry 108 has been further described in detail, for example in FIGS. 2, 3, and 4.

Figure 2:
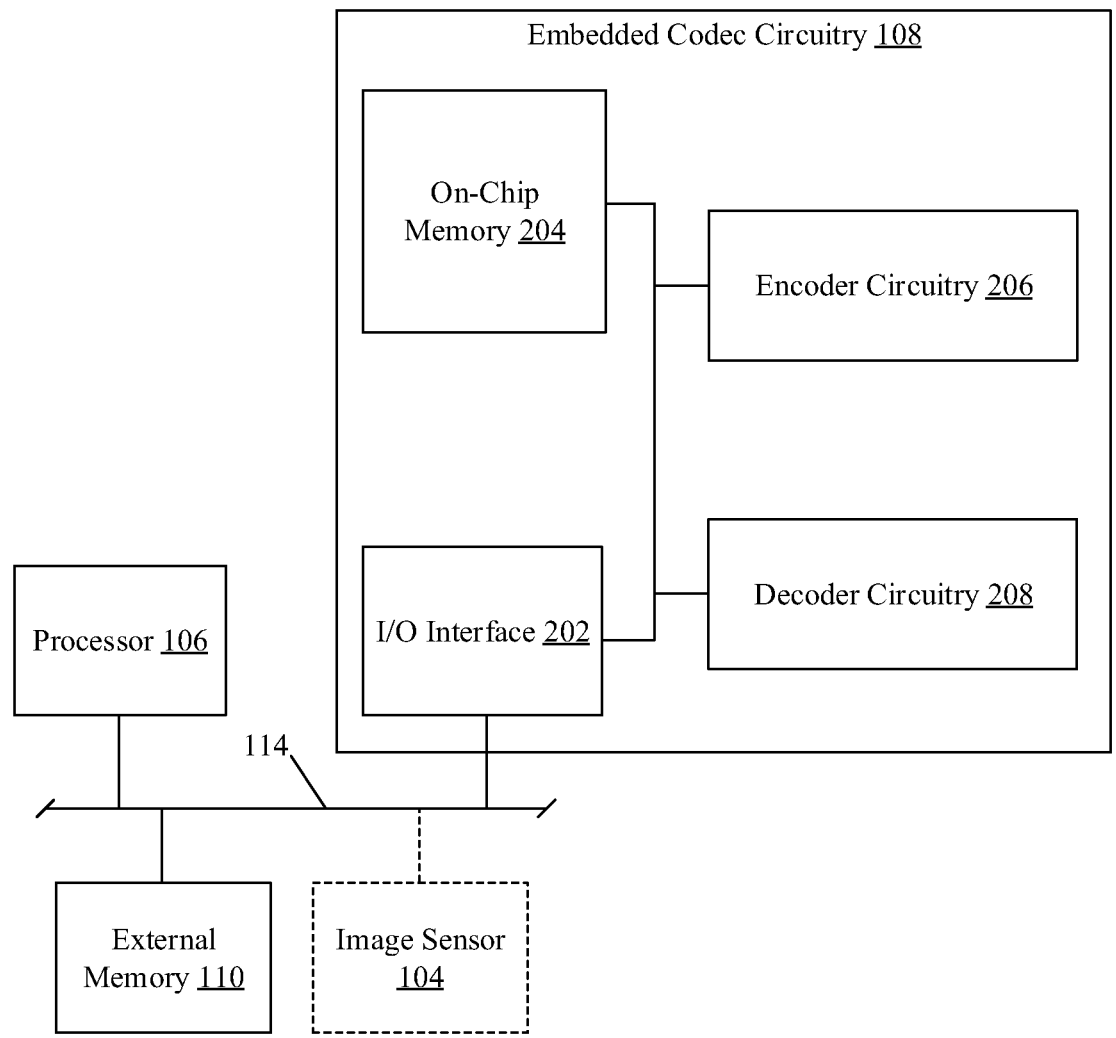
FIG. 2 is a block diagram that illustrates the EBC circuitry of FIG. 1 with various peripheral components for frequency-dependent coding of transform coefficients, in accordance with an embodiment of the disclosure.

FIG. 2 is a block diagram that illustrates the EBC circuitry of FIG. 1 with various peripheral components for frequency-dependent coding of transform coefficients, in accordance with an embodiment of the disclosure. FIG. 2 is explained in conjunction with elements from FIG. 1. With reference to FIG. 2, there is shown a block diagram 200 of the EBC circuitry 108. The EBC circuitry 108 may include an Input/output (I/O) interface 202, an on-chip memory 204, an encoder circuitry 206, and a decoder circuitry 208. In the block diagram 200, there is also shown the image sensor 104, the processor 106, and the external memory 110 communicatively coupled to the EBC circuitry 108, via the system bus 112. In some embodiments, the processor 106 and the external memory 110 may be implemented inside the EBC circuitry 108, without a deviation from the scope of the disclosure.

The I/O interface 202 may comprise suitable logic, circuitry, and interfaces that may be configured to manage a plurality of I/O ports to facilitate exchange of communication data from other peripheral circuitries, via the system bus 112, for example, the external memory 110, the processor 106, or the image sensor 104. The communication data may include a bit-stream of the encoded image block, control signals, CPU instructions, and the like. The configuration of the I/O ports may depend on a specification of the EBC circuitry 108, for example, physical I/O pins in an ASIC, FPGA or a SoC chip.

The on-chip memory 204 may comprise suitable logic, circuitry, and interfaces that may be configured to store different operational data (e.g., transform domain data, residual levels, quantization levels, entropy coded bits, etc.) that may be utilized by different components of the EBC circuitry 108 to encode the input image block. Examples of the operational data that the on-chip memory 204 may be configured to store may include, but are not limited to, a bit-stream of encoded image block, transform-domain data, quantized-transformed levels, quantized-transformed residual levels, and 1D/2D image blocks. The on-chip memory 204 may be implemented as a specific memory designed with a defined memory specification, such as R/W speed, memory size, fabrication factors, and the like. Examples of the on-chip memory 204 may include, but are not limited to, static random access memory (SRAM), dynamic access memory (DRAM), and Static Dynamic RAM (SD-RAM).

The encoder circuitry 206 may comprise suitable logic, circuitry, and interfaces that may be configured to generate a bit-stream of encoded input image block by application of a sequential encoding scheme (includes a frequency-dependent entropy coding) on the input image block, stored in a memory, such as the on-chip memory 204 or the external memory 110. The encoder circuitry 206 may be optimized to reduce a number of bits that may be used to encode an input block of transform coefficients (corresponds to the input image block) to improve a compaction efficiency and/or a compression factor of the inputted image block. In some embodiments, the encoder circuitry 206 may be a hardware encoder chip that may be implemented based on one of ASIC, programmable logic devices (PLDs), SOC, FPGA, digital signal processors (DSPs) or other specialized circuitries. In other embodiments, the encoder circuitry 206 may be implemented as a combination of hardware and stored set of instructions in the on-chip memory 204 (for example, instructions based on VHDL or HDL logic).

The decoder circuitry 208 may comprise suitable logic, circuitry, and interfaces that may be configured to decode a bit-stream of encoded input image block based on header information and grouping tables that may be pre-stored or transmitted along with the bit-stream of encoded input image block. The grouping tables may indicate different groups and entropy coding parameters for a specific input image block. The decoder circuitry 208 may have pre-stored quantization tables and coding tables that may act as a reference for the decoder circuitry 208 to decode the bit-stream of encoded input image block. In some embodiments, the decoder circuitry 208 may be a hardware encoder chip that may be implemented based on one of ASIC, programmable logic devices (PLDs), SOC, FPGA, digital signal processors (DSPs), or other specialized circuitries. In other embodiments, the decoder circuitry 208 may be implemented as a combination of hardware and stored set of instructions in the on-chip memory 204 (for example, instructions based on VHDL or HDL logic).

In operation, an input image or an input image block (as part of a sequence of input image blocks) may be received by the encoder circuitry 206. The input image may be stored in a memory, such as the external memory 110 or the on-chip memory 204, of the media device 102. In some embodiments, the processor 106 may be configured to partition the input image into a sequence of input image blocks, where each input image block may represent a patch (or a set of pixels in a region) of the input image. For example, a "1280×720" input image has "80" "16×9" input image blocks. The encoder circuitry 206 may be configured to generate a plurality of input blocks of transform coefficients. For example, "80" "16×9" input blocks of transform coefficients may be generated after a sequential application of a "16×1" row DCT-II transform, a "1×9" column DCT-II transform on each "16×9" input image block of the "80" input image blocks, a quantization with a quantization parameter of "7", and followed by a PCM/DPCM coding of quantized-transformed levels in each "16×9" input image block of the "80" input image blocks. Here, in this example, "16×1" and "1×9" represents a portion of the input image block that may be transformed by application of the 1D row DCT transform and the 1D column DCT transform, respectively.

In some embodiments, the input block may be a block that corresponds to one of a luminance image block, a chroma-U image block, or a chroma-V image block. The luminance image block, the chroma-U image block, or the chroma-V image block may be represent an RGB input image block in YUV (or Y'UV or YCbCr) color space. Here, "Y" represents the luminance component of the RGB input image block, "U" and "'V" represents chroma components of the RGB input image block.

In accordance with an embodiment, in order to entropy encode the input block of transform coefficients, the encoder circuitry 206 may be configured to retrieve the input block from the memory, such as the on-chip memory 204. The input block may include a plurality of transform coefficients, which may be a combination of DC transform coefficients and AC transform coefficients. The position of the DC and AC transform coefficients in the input block may be based on a direction selected for an application of 1D row transform or a 1D column transform on the plurality of pixel values of the input image block. For example, an application of a 1 D-row DCT transform may generate a DC transform coefficient at a first position and remaining AC transform coefficients at subsequent positions in different rows of the first block. Similarly, a successive application of a 1 D-column DCT transform after an application of 1D row transform may generate a DC transform coefficient at a first position and remaining AC transform coefficients at subsequent positions in different columns of the first block.

The direction of application of a transform and a type of transform applied on the input image block may specify a distribution of transform coefficients in the input block. For example, after application of 1D row DCT transform, all the low frequency transform coefficients may occur near the leftmost portion of the input block and the frequency of transform coefficients may increase as the input block is scanned from left to right (i.e. from DC transform coefficient to AC transform coefficients). It may be further observed that the low frequency (or less frequently occurring transform coefficients) may have higher absolute values, which may indicate that the low frequency transform coefficients exhibit higher compaction energy. Similarly, the high frequency transform coefficients (or transform coefficients that occur frequency in the input block) may have lower absolute values, which may indicate that the low frequency transform coefficients exhibit low compaction energy. Thus, on the basis of frequency distribution, the encoder circuitry 206 may be configured to selectively encode a plurality of transform coefficients in the input block, based on the frequency distribution of different DC and AC transform coefficients in the input block. Thus, the EBC circuitry 108 may be configured to determine the frequency distribution of the plurality of transform coefficients for the input image block. Some examples of the frequency distribution has been provided in FIG. 4B. The frequency distribution may be determined in order to group the plurality of transform coefficients into a plurality of groups. The EBC circuitry 108 may be configured to group a plurality of transform coefficients for an input image block into a plurality of groups of transform coefficients. The plurality of transform coefficients may be grouped, based on the frequency distribution of the plurality of transform coefficients for the input image block. Also, in some embodiments, the plurality of transform coefficients for the input image block may be grouped into the plurality of groups differently for a luma and a chroma component of the input image block. For example, there may be four different input blocks, where each input block may represent either a chroma or a luma components and transform coefficients in each input block (e.g., after application of 1D row DCT and/or 1D column DCT) may be discretely analyzed to form a plurality of groups, such as 3 different groups, i.e. type 0, type 1, and type 2.

In accordance with an embodiment, the encoder circuitry 206 may be configured to group one or more transform coefficients of the plurality of transform coefficients into a single group of the plurality of groups. The one or more transform coefficients grouped into the single group may exhibit a specific pattern in the frequency distribution. The grouping position of the plurality of transform coefficients for the input image block may pre-fixed in accordance with a transform coding scheme applied on the input image block. The specific pattern may indicate pre-fixed grouping positions in the input block.

For example, an input block (IB) (i.e. a 8×4 input block) may be obtained from an "8×4" image block, given as follows:

$$IB = \begin{matrix} -22 & 9 & 0 & 1 & 0 & 1 & 0 & -1 \\ -2 & 3 & 7 & 5 & -1 & 0 & 1 & 0 \\ 4 & -8 & 3 & -4 & 1 & 2 & 1 & -1 \\ -2 & 2 & 4 & 1 & 0 & 1 & -1 & 0 \end{matrix}$$

In the input block (IB), transform coefficients (such as 0, 1, and −1) may exhibit a high frequency in the frequency distribution, transform coefficients (such as −2 and 2) may exhibit moderate frequency in the frequency distribution, and transform coefficients (such as −22 to 9) may exhibit lowest frequency in the frequency distribution. Thus, the encoder circuitry 206 may be configured to group the high frequency coefficients as a first (Type 0) group, moderate frequency coefficients as a second (Type 1) group, and low frequency coefficients as a third (Type 2) group. An example of different groups in various input blocks has been provided in FIGS. 5A and 5B in detail.

The encoder circuitry 206 may be further configured to select a different entropy coding parameter from a set of entropy coding parameters for each group of the plurality of groups, based on the frequency distribution. By selection of the different entropy coding parameter, the encoder circuitry 206 may be further configured to set a maximum code length for a particular group among the plurality of groups. More specifically, the maximum code length may indicate an upper limit or a maximum number of bits that may be generated as an equivalent code for a particular transform coefficient in the input block.

The encoder circuitry 206 may be further configured to apply an entropy coding scheme from a set of entropy coding schemes to each group of transform coefficients in accordance with the selected entropy coding parameter. The entropy coding scheme that may be applied on each group of transform coefficients may be a conditional variable length coding (CVLC) scheme. In a CVLC scheme, different groups or position-dependent regions in an input block of transform coefficients may be differentially encoded by codes of different length based on a condition, such as the frequency distribution. The set of entropy coding schemes may include, but are not limited to, a Huffman coding scheme, an exponential-Golomb coding scheme, a Golomb-Rice coding scheme, an arithmetic coding scheme, a Lempel-Ziv-Welch coding scheme, and a PGC scheme. In accordance with an embodiment, the selected entropy coding scheme may be the PGC scheme and the different entropy coding parameter of the PGC scheme may be utilized to generate progressive Golomb codes for a corresponding group of the plurality of groups of transform coefficients. The plurality of transform coefficients in the plurality of groups may be entropy coded in parallel and independent of each other.

For example, the input block (IB) may be encoded using the PRG scheme, and therefore, the PRG parameters may be selected from a set of PRG parameters for each group of the plurality of groups. In such implementation, a PRG parameter may be a tunable parameter (represented by "M") in the generalized Golomb coding scheme. The selection of the tunable parameter "M" may depend on variations in occurrence (or frequency) of different values of transform coefficients in different groups of an input block. For a "Type 0" group, the transform coefficients may have values predominantly in a range of "−1 to 1". In such a case, different PRG parameters may indicate a maximum count of bits (e.g., "3 bits" for Unary and "8 bits" for G2) that may be allocated to transform coefficients in the Type 0 group. For a "Type 1" group, the transform coefficients may have values predominantly in a range of "−3 to 3". In such a case, different PRG parameters may indicate a maximum count of bits (e.g., "8 bits") that may be allocated to transform coefficients in the Type 1 group. For a "Type 2" group, the transform coefficients may have values predominantly in a range of −10 to 10. In such a case, the PRG parameter may not indicate a maximum count of bits for allocation to transform coefficients in the Type 2 group.

The encoder circuitry 206 may be further configured to generate a bit-stream of encoded image block by application of the entropy coding scheme. An average peak signal to noise ratio (PSNR) for a decoded input image block from the bit-stream may be greater than a PSNR for the input image block. As an example, average PSNR for 10 High Definition (HD) images for Y, U, and V color coding at different bits per samples (bps) has been provided in Table 1, as follows:

TABLE 1

Improvement in Average PSNR of 10 HD Images over Exp-Golomb Scheme

| Average PSNR (10 HD Images) | 3 bps | | | 4 bps | | | 5 bps | | |
|---|---|---|---|---|---|---|---|---|---|
| | Y | U | V | Y | U | V | Y | U | V |
| Exp-Golomb | 47.01 | 61.11 | 62.29 | 53.08 | 68.34 | 70.58 | 59.10 | 78.57 | 81.51 |
| PRG Scheme | 48.03 | 62.66 | 64.13 | 54.14 | 70.67 | 73.66 | 60.03 | 82.30 | 84.61 |
| Improvement | +1.02 | +1.55 | +1.84 | +1.05 | +2.33 | +3.08 | +0.93 | +3.74 | +3.10 |

In Table 1, the average PSNR values for Y, U, and V color components of 10 HD images are shown for exp-Golomb entropy coding scheme and PRG scheme. Evidently, the average PSNR values for PRG scheme at different bit rates (bits per sample) show significant improvements in terms of noise reduction as compared to exp-Golomb coding scheme.

By adaptively coding different groups as per a particular frequency distribution, effect of several compression artifacts (e.g., block artifacts) may be reduced when the bitstream of encoded input Image blocks is reconstructed to generate an input image. Also, by reduction of several compression artifacts, the average PSNR of the input image adaptively increases as compared to that for conventional entropy coding schemes, such as the exp-Golomb coding scheme. By creating different groups in an input block of transform coefficients and selection of optimal entropy coding parameter (e.g., a PGC parameter) for every group, an optimal bit allocation may be achieved as per a target bit-budget for the input image block, which may also result in an improvement in the compression factor.

Figure 3:
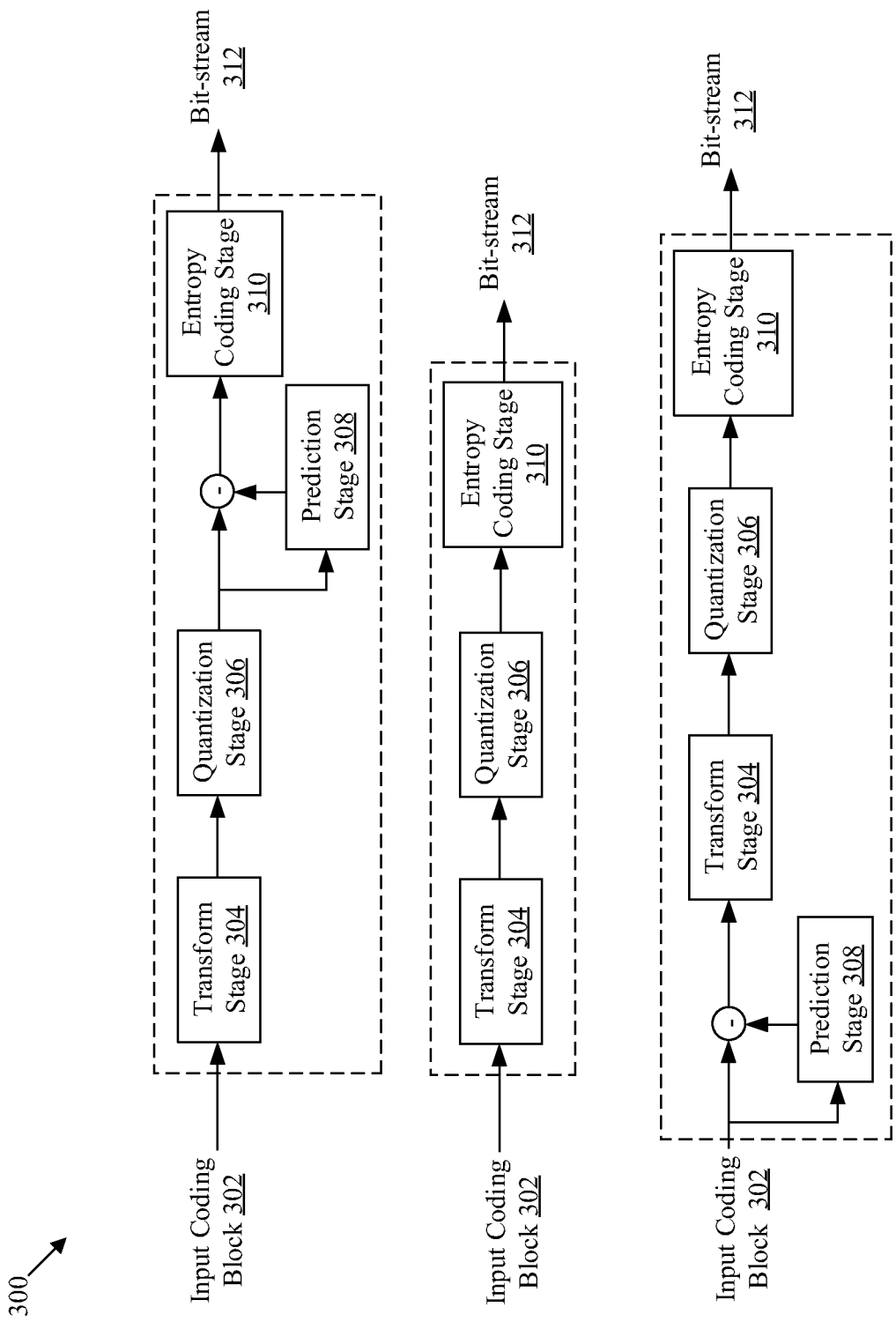
FIG. 3 is a block diagram that illustrates different exemplary variations in coding stages of the EBC circuitry of FIG. 2, in accordance with an embodiment of the disclosure.

FIG. 3 is a block diagram that illustrates different exemplary variations in coding stages of the EBC circuitry of FIG. 2, in accordance with an embodiment of the disclosure. FIG. 3 is explained in conjunction with elements from FIGS. 1 and 2. With reference to FIG. 3, there is shown a block diagram 300 of three different variations in coding stages (also referred to as a coding architecture or a sequencial encoding scheme) of the EBC circuitry 108. In a first coding architecture (a first variation), there is shown an input coding block 302 that may be first transformed into an input block of transform coefficients at the transform stage 304. Thereafter, the transform coefficients may be quantized at a quantization stage 306 into quantized-transformed levels, which may be further processed at a prediction stage 308 to obtain quantized-transformed residual levels. At entropy coding stage 310, the quantized-transformed residual levels may be entropy coded by application of an entropy coding scheme, in accordance with an entropy coding parameter, to generate a bit-stream 312. For example, the entropy coding scheme may be the PGC scheme applied in accordance with different PGC parameters for different groups in the input coding block 302. In a second coding architecture (a second variation), the input coding block 302 may be inputted sequentially to the transform stage 304, the quantization stage 306, and the entropy coding stage 310, without the prediction stage 308. In a third coding architecture, the prediction stage 308 may precede the transform stage 304 and remaining stages may remain same as that of the first variation. The aforementioned variations are merely examples of some of the variations in coding stages of the EBC circuitry 108. Thus, the EBC circuitry 108 may have other variations in the number and a sequence of coding stages, without a deviation from scope of the disclosure.

FIG. 4A illustrates variations in application of different transform coding schemes for an input image block, in accordance with an embodiment of the disclosure. FIG. 4A is explained in conjunction in elements from FIGS. 1, 2, and 3. With reference to FIG. 4A, there is shown an exemplary scenario 400A, where two different transform coding schemes are applied on a first input block 402 and a second input block 404, respectively. The first input block 402 may include a plurality of transform coefficients arranged in an 8×4 block. The plurality of transform coefficients may be obtained after application of 1D column DCT on a plurality of pixels in the 8×4 block. The direction of application of the 1D column DCT may be vertically downwards (as shown, for example) along each column of the first input block 402. In such cases, all the low frequency coefficients (i.e. that occur less frequently and exhibit most of the compaction energy of the first input block 402) may appear near the topmost region of the first input block 402. The frequency may gradually decrease as the first input block 402 may be scanned towards the bottommost region. The bottommost region may include all the high frequency coefficients (i.e. that occur more frequently and exhibit least of the compaction energy of the first input block 402).

The second input block 404 may also include a plurality of transform coefficients arranged in an 8×4 block. The plurality of transform coefficients may be obtained after application of 1D row DCT on a plurality of pixels in the 8×4 block. The direction of application of the 1D row DCT may be horizontally from left to right along each row of the second input block 404. In such cases, all the low frequency coefficients (i.e. that occur less frequently and exhibit most of the compaction energy of the second input block 404) may appear near the leftmost region of the second input block 404. The frequency may gradually decrease as the second input block 404 may be scanned towards the rightmost region (as shown, for example). The rightmost region may include all the high frequency coefficients (i.e. that occur more frequently and exhibit least of the compaction energy of the second input block 404).

FIG. 4B illustrates frequency distribution of high frequency and low frequency coefficients in a block of transform coefficients, in accordance with an embodiment of the disclosure. FIG. 4B is explained in conjunction with elements from FIGS. 1, 2, 3, and 4A. With reference to FIG. 4B, there is shown a sequence of graphs 400B arranged in an order of low frequency transform coefficients to high frequency transform coefficients. In the sequence, each graph maps a particular region of the first input block 402 or the second input block 404 of transform coefficients. In the sequence of graphs 400B, there is shown a first graph 406 that maps the low frequency coefficients, i.e. the topmost region, of the first input block 402 or the leftmost region of the second input block 404. With each subsequent graph, such as a second graph 408, a third graph 410, and a fourth graph 412, the frequency of transform coefficients increases and the mapped region gradually progresses towards the bottommost region of the first input block 402 or the rightmost region of the second input block 404. The first graph 406, the second graph 408, the third graph 410, and the fourth graph 412 in the sequence of graphs 400B may also depict the frequency distribution of transform coefficients in different regions (position-specific) of the first input block 402 or the second input block 404. Thus, the encoder circuitry 206 may be configured to group the plurality of transform coefficients for the first input block 402 or the second input block 404 (corresponding to an input image block) into a plurality of groups of transform coefficients, based on the frequency distribution (as shown in the sequence of graphs 400B) of the plurality of transform coefficients.

Figure 5A:
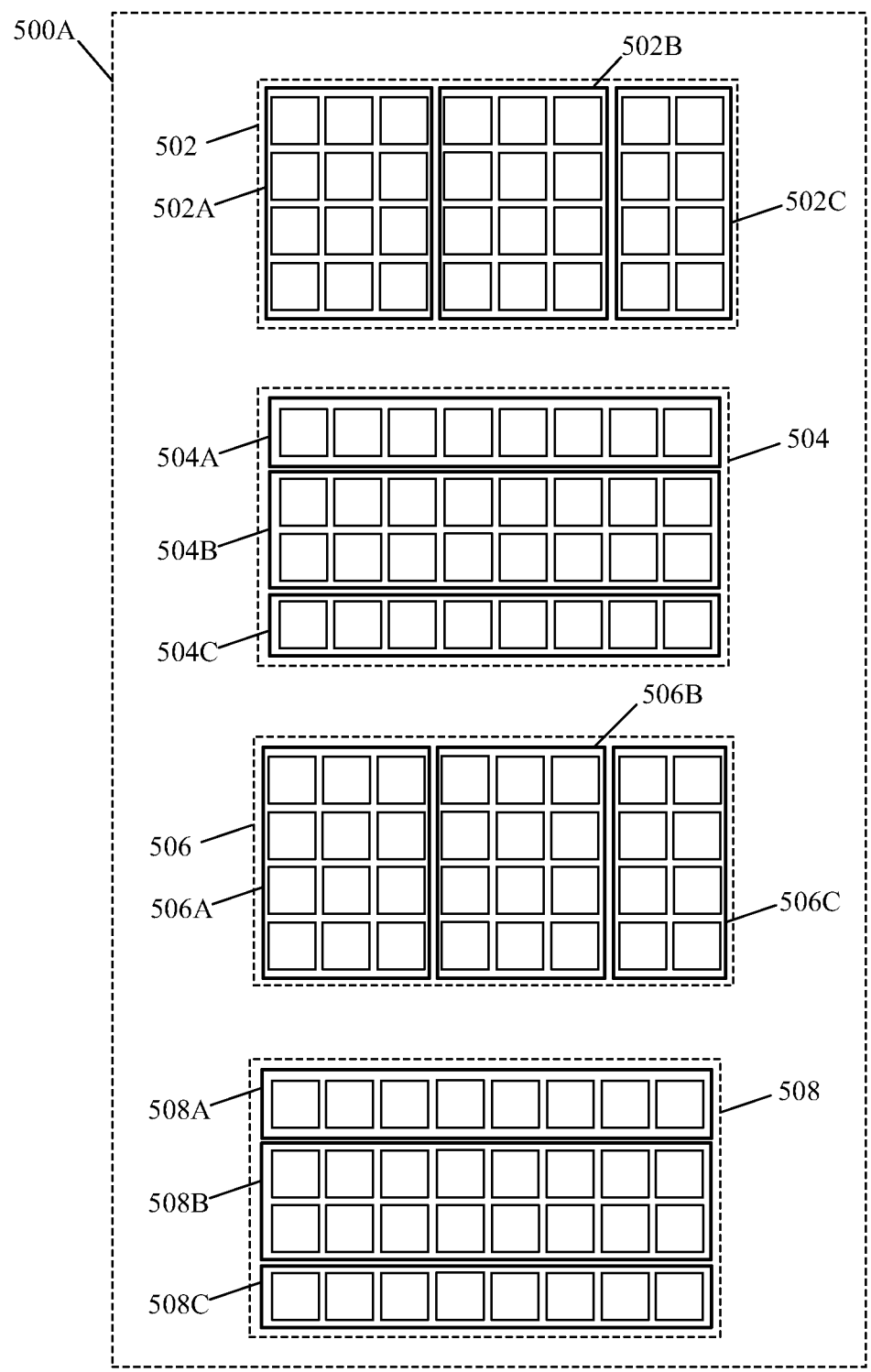
FIG. 5A illustrates different pre-fixed groups in the luma and chroma blocks for an input image block, in accordance with an embodiment of the disclosure.

FIG. 5A illustrates different pre-fixed groups in the luma and chroma blocks for an input image block, in accordance with an embodiment of the disclosure. FIG. 5A is explained in conjunction with elements from FIGS. 1, 2, 3, 4A, and 4B. With reference to FIG. 5A, there is shown an exemplary grouping scenario 500A, where transform coefficients in different input blocks are grouped into a plurality of groups. In the grouping scenario 500A, there is shown a first luma block 502, a second luma block 504, a first chroma block 506, and a second chroma block 508.

The first luma block 502 may correspond to a luma color component of an input image block. The first luma block 502 may include a plurality of transform coefficients (e.g., "32" transform coefficients in an "8×4" block) that may be obtained after an application of 1D row DCT on each row of the first luma block 502. The plurality of transform coefficients in the first luma block 502 are grouped into three different groups, i.e. a first group 502A, a second group 502B, and a third group 502C, respectively. The first group 502A, the second group 502B, and the third group 502C may include low frequency transform coefficients, moderate frequency transform coefficients and high frequency transform coefficients (e.g. zero coefficients or near zero coefficients), respectively.

The second luma block 504 may also correspond to a luma color component of an input image block. The second luma block 504 may include a plurality of transform coefficients (e.g., "32" transform coefficients in an "8×4" block) that may be obtained after an application of 1D column DCT on each column of the second luma block 504. The plurality of transform coefficients in the second luma block 504 are grouped into three different groups, i.e. a first group 504A, a second group 504B, and a third group 504C, respectively. The first group 504A, the second group 504B, and the third group 504C may include low frequency transform coefficients, moderate frequency transform coefficients, and high frequency transform coefficients, respectively.

The first chroma block 506 may correspond to a chroma (U or V) color component of an input image block. The first chroma block 506 may include a plurality of transform coefficients (e.g., "32" transform coefficients in an "8×4" block) that may be obtained after an application of 1D row DCT on each row of the first chroma block 506. The plurality of transform coefficients in the first chroma block 506 are grouped into three different groups, i.e. a first group 506A, a second group 506B, and a third group 506C, respectively. The first group 506A, the second group 506B, and the third group 506C may include low frequency transform coefficients, moderate frequency transform coefficients, and high frequency transform coefficients, respectively.

The second chroma block 508 may also correspond to a chroma (U or V) color component of an input image block. The second chroma block 508 may include a plurality of transform coefficients (e.g., "32" transform coefficients in an "8×4" block) that may be obtained after an application of 1D column DCT on each column of the second chroma block 508. The plurality of transform coefficients in the second chroma block 508 are grouped into three different groups, i.e. a first group 508A, a second group 508B, and a third group 508C, respectively. The first group 508A, the second group 508B, and the third group 508C may include low frequency transform coefficients, moderate frequency transform coefficients, and high frequency transform coefficients, respectively.

FIG. 5B illustrates a coding table, where different groups of transform coefficients are entropy coded in accordance with a different entropy coding parameter, in accordance with an embodiment of the disclosure. FIG. 5B is explained in conjunction with elements from FIGS. 1, 2, 3, 4A, 4B, and 5A. With reference to FIG. 5B, there is shown a coding table 500B that is an exemplary coding table for an application of the PRG scheme on different groups of transform coefficients of an input block. In the coding table 500B, there are separate tables for a group (Type 0), a group (Type 1), and a group (Type 2). The type 0 group corresponds to the first group 502A, 504A, 506A, and 508A. The type 1 group corresponds to the second group 502B, 504B, 506B, and 508B and the type 2 group corresponds to the third group 502C, 504C, and 506C, and 508C. As shown in the coding table 500B, the maximal code length for high frequency transform coefficients (e.g., −1, 0, and 1) is "3" bits (for unary coding in the PGC scheme), the moderate frequency transform coefficients (e.g., −3, −2, 3, and 2) is "8" bits, and the low frequency transform coefficients (e.g., −10, −9, 8) is unrestricted and depends on selected tunable parameter in the PGC scheme.

Figure 6:
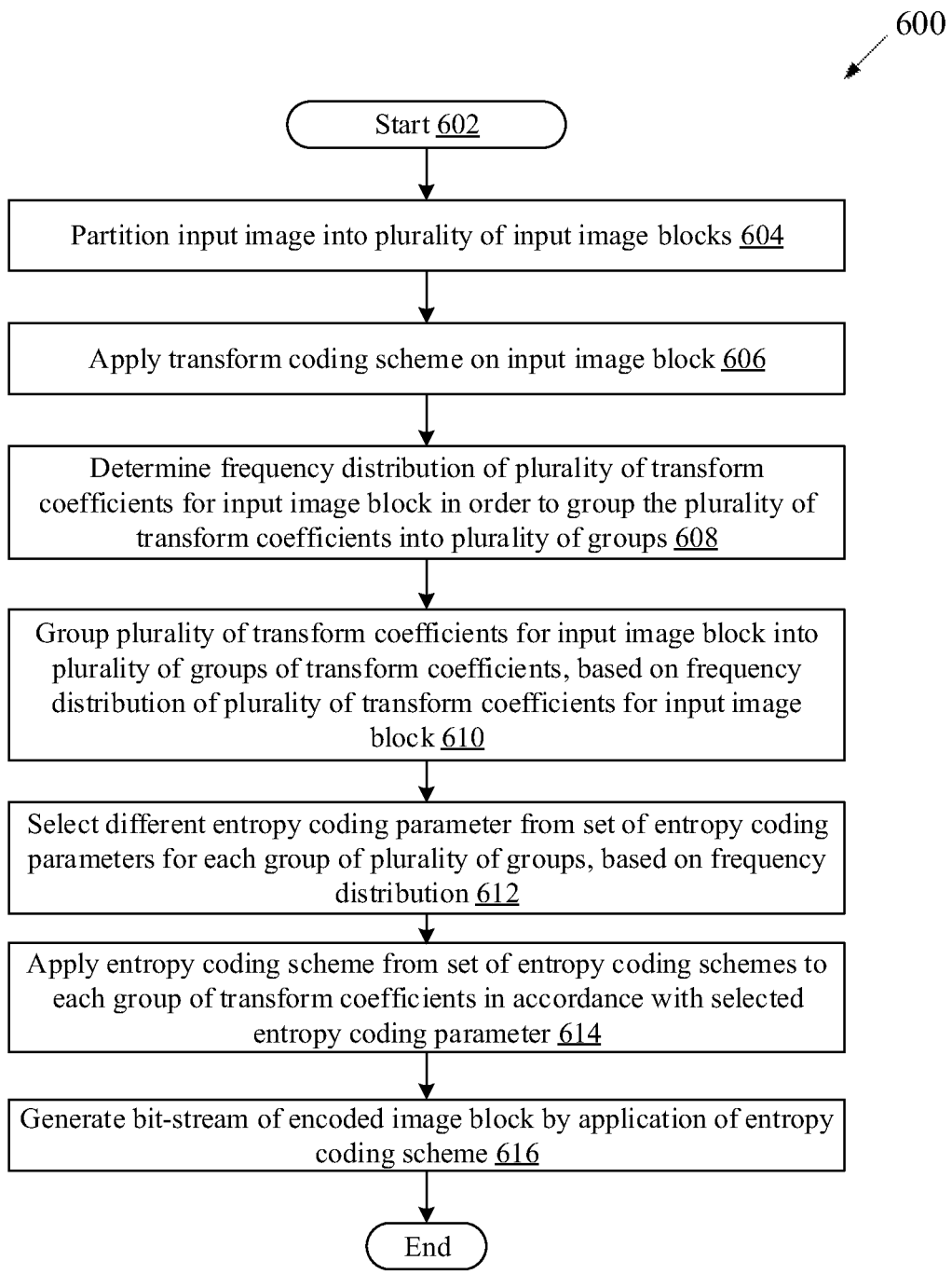
FIG. 6 is a flowchart that illustrates exemplary operations for frequency-dependent coding of transform coefficients, in accordance with an embodiment of the disclosure.

FIG. 6 is a flowchart that illustrates exemplary operations for frequency-dependent coding of transform coefficients, in accordance with an embodiment of the disclosure. FIG. 6 is explained in conjunction with elements from FIGS. 1, 2, 3, 4A, 4B, 5A, and 5B. With reference to FIG. 6, there is shown a flowchart 600 that includes exemplary operations of the EBC circuitry 108 from 602 to X. The operations start at 602 and proceeds to 604.

At 604, an input image may be partitioned into a plurality of input image blocks. The processor 106 may be configured to partition the input image into the plurality of image blocks. The plurality of input image blocks may be stored in the memory, such as the external memory 110 or the on-chip memory 204.

At 606, a transform coding scheme may be applied on an input image block. The encoder circuitry 206 may be configured to apply the transform coding scheme on the input image block. The transform coding scheme may correspond to one of: a 1D row DCT transform, a 1D column DCT transform, or a 2D DCT transform. The input image block may be transformed to an input block of transform coefficients after application of the transform coding scheme.

At 608, a frequency distribution of the plurality of transform coefficients for the input image block may be determined in order to group the plurality of transform coefficients into a plurality of groups. The encoder circuitry 206 may be configured to determine the frequency distribution of the plurality of transform coefficients for the input image block in order to group the plurality of transform coefficients into the plurality of groups.

At 610, the plurality of transform coefficients for the input image block may be grouped into the plurality of groups of transform coefficients, based on the frequency distribution of the plurality of transform coefficients for the input image block. The encoder circuitry 206 may be configured to group the plurality of transform coefficients for the input image block into the plurality of groups of transform coefficients, based on the frequency distribution of the plurality of transform coefficients for the input image block.

At 612, different entropy coding parameter may be selected for each group of the plurality of groups from a set of entropy coding parameters, based on the frequency distribution. The encoder circuitry 206 may be configured to select a different entropy coding parameter from the set of entropy coding parameters for each group of the plurality of groups, based on the frequency distribution.

At 614, an entropy coding scheme from a set of entropy coding schemes may be applied on each group of the plurality of groups of transform coefficients, in accordance with the selected entropy coding parameter. The encoder circuitry 206 may be configured to apply the entropy coding scheme from the set of entropy coding schemes on each group of the plurality of groups of transform coefficients, in accordance with the selected entropy coding parameter.

At 616, a bit-stream of encoded image block may be generated by application of the entropy coding scheme. The encoder circuitry 206 may be configured to generate the bit-stream of encoded image block by the application of the entropy coding scheme. Control passes to end.

Various embodiments of the disclosure may provide a non-transitory, computer readable medium and/or storage medium, and/or a non-transitory machine readable medium and/or storage medium stored thereon, a machine code and/or a computer program with at least one code section executable by a machine and/or a computer for block-based decompression of digital content. The code section may cause the machine and/or computer to perform the steps that comprise group a plurality of transform coefficients for an input image block into a plurality of groups of transform coefficients. The plurality of transform coefficients may be grouped based on a frequency distribution of the plurality of transform coefficients for the input image block. In accordance with an embodiment, the encoder circuitry may be configured to determine the frequency distribution of the plurality of transform coefficients for the input image block in order to group the plurality of transform coefficients into the plurality of groups. The encoder circuitry may be further configured to select a different entropy coding parameter from a set of entropy coding parameters for each group of the plurality of groups, based on the frequency distribution. Thereafter, the encoder circuitry may be further configured to apply an entropy coding scheme from a set of entropy coding schemes to each group of transform coefficients, in accordance with the selected entropy coding parameter.

Certain embodiments of the disclosure may be found in an embedded codec (EBC) circuitry (such as the EBC circuitry 108). Various embodiments of the disclosure may provide the EBC circuitry that may include an encoder circuitry (such as the encoder circuitry 206). The encoder circuitry may be configured to group a plurality of transform coefficients for an input image block into a plurality of groups of transform coefficients. The plurality of transform coefficients may be grouped based on a frequency distribution of the plurality of transform coefficients for the input image block. In accordance with an embodiment, the encoder circuitry may be configured to determine the frequency distribution of the plurality of transform coefficients for the input image block in order to group the plurality of transform coefficients into the plurality of groups. The encoder circuitry may be further configured to select a different entropy coding parameter from a set of entropy coding parameters for each group of the plurality of groups, based on the frequency distribution. Thereafter, the encoder circuitry may be further configured to apply an entropy coding scheme from a set of entropy coding schemes to each group of transform coefficients, in accordance with the selected entropy coding parameter.

In accordance with an embodiment, the selected entropy coding scheme may be a progressive Golomb coding (PGC) scheme. The different entropy coding parameter of the PGC scheme may be utilized to entropy code a corresponding group of the plurality of groups of transform coefficients. The set of entropy coding schemes may include a Huffman coding scheme, an exponential-Golomb coding scheme, a Golomb-Rice coding scheme, an arithmetic coding scheme, a Lempel-Ziv-Welch coding scheme, and a PGC scheme.

In accordance with an embodiment, the encoder circuitry may be configured to apply a transform coding scheme on the input image block. The transform coding scheme may correspond to one of: a one dimensional (1D) row discrete cosine transform (DCT) or a 1D column DCT. Alternatively, the transform coding scheme may correspond to a two dimensional (2D) DCT.

In accordance with an embodiment, the encoder circuitry may be further configured to group one or more transform coefficients of the plurality of transform coefficients into a single group of the plurality of groups. The one or more transform coefficients grouped into the single group may exhibit a specific pattern in the frequency distribution. Also, a grouping position of the plurality of transform coefficients for the input image block may be pre-fixed in accordance with a transform coding scheme applied on the input image block. The plurality of transform coefficients in the plurality of groups may be entropy coded in parallel and independent of each other.

In accordance with an embodiment, the encoder circuitry may be further configured to generate a bit-stream of encoded image block by application of the entropy coding scheme. An average peak signal to noise ratio (PSNR) for a decoded input image block from the bit-stream is greater than a PSNR for the input image block. In accordance with an embodiment, the plurality of transform coefficients for the input image block are grouped into the plurality of groups differently for a luma and a chroma component of the input image block.

The present disclosure may be realized in hardware, or a combination of hardware and software. The present disclosure may be realized in a centralized fashion, in at least one computer system, or in a distributed fashion, where different elements may be spread across several interconnected computer systems. A computer system or other apparatus adapted to carry out the methods described herein may be suited. A combination of hardware and software may be a general-purpose computer system with a computer program that, when loaded and executed, may control the computer system such that it carries out the methods described herein. The present disclosure may be realized in hardware that comprises a portion of an integrated circuit that also performs other functions.

The present disclosure may also be embedded in a computer program product, which comprises all the features that enable the implementation of the methods described herein, and which when loaded in a computer system is able to carry out these methods. Computer program, in the present context, means any expression, in any language, code or notation, of a set of instructions intended to cause a system with information processing capability to perform a particular function either directly, or after either or both of the following: a) conversion to another language, code or notation; b) reproduction in a different material form.

While the present disclosure has been described with reference to certain embodiments, it will be understood by those skilled in the art that various changes may be made and equivalents may be substituted without departure from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:
1. An embedded codec (EBC) circuitry, comprising: encoder circuitry configured to:
    group a plurality of transform coefficients for an input image block into a plurality of groups of transform coefficients, based on a frequency distribution of the plurality of transform coefficients for the input image block;
    select a different entropy coding parameter from a set of entropy coding parameters for each group of the plurality of groups of transform coefficients, based on the frequency distribution; and
    apply an entropy coding scheme from a set of entropy coding schemes to each group of the plurality of groups of transform coefficients based on the selected entropy coding parameter.
2. The EBC circuitry according to claim 1, wherein the encoder circuitry is further configured to determine the frequency distribution of the plurality of transform coefficients for the input image block to group the plurality of transform coefficients into the plurality of groups of transform coefficients.
3. The EBC circuitry according to claim 1, wherein
    the entropy coding scheme is a progressive Golomb coding (PGC) scheme, and
    the encoder circuitry is further configured to entropy code a group of the plurality of groups of transform coefficients based on the different entropy coding parameter of the PGC scheme.
4. The EBC circuitry according to claim 1, wherein the set of entropy coding schemes comprises a Huffman coding scheme, an exponential-Golomb coding scheme, a Golomb-Rice coding scheme, an arithmetic coding scheme, a Lempel-Ziv-Welch coding scheme, and a progressive Golomb coding (PGC) scheme.
5. The EBC circuitry according to claim 1, wherein
    the encoder circuitry is further configured to apply a transform coding scheme on the input image block, and
    the transform coding scheme corresponds to one of a one dimensional (1D) row discrete cosine transform (DCT) or a 1D column DCT.
6. The EBC circuitry according to claim 5, wherein the transform coding scheme corresponds to a two dimensional (2D) DCT.
7. The EBC circuitry according to claim 1, wherein
    the encoder circuitry is further configured to group one or more transform coefficients of the plurality of transform coefficients into a single group of the plurality of groups of transform coefficients, and
    the one or more transform coefficients grouped into the single group exhibit a specific pattern in the frequency distribution.
8. The EBC circuitry according to claim 1, wherein a grouping position of the plurality of transform coefficients for the input image block is fixed based on a transform coding scheme applied on the input image block.
9. The EBC circuitry according to claim 1, wherein
    the encoder circuitry is further configured to entropy code the plurality of transform coefficients in the plurality of groups of transform coefficients in parallel and independent of each other.
10. The EBC circuitry according to claim 1, wherein the plurality of transform coefficients for the input image block are grouped into the plurality of groups of transform coefficients differently for a luma component and a chroma component of the input image block.
11. The EBC circuitry according to claim 1, wherein the encoder circuitry is further configured to generate a bit-stream of encoded image block based on application of the entropy coding scheme.
12. The EBC circuitry according to claim 11, wherein an average peak signal to noise ratio (PSNR) for a decoded input image block from the bit-stream is greater than a PSNR for the input image block.
13. A method, comprising:
    in an embedded codec (EBC) circuitry that comprises encoder circuitry:
        grouping, by the encoder circuitry, a plurality of transform coefficients for an input image block into a plurality of groups of transform coefficients, based on a frequency distribution of the plurality of transform coefficients for the input image block;
        selecting, by the encoder circuitry, a different entropy coding parameter from a set of entropy coding parameters for each group of the plurality of groups of transform coefficients, based on the frequency distribution; and
        applying, by the encoder circuitry, an entropy coding scheme from a set of entropy coding schemes to each group of the plurality of groups of transform coefficients based on the selected entropy coding parameter.
14. The method according to claim 13, further comprising determining, by the encoder circuitry, the frequency distribution of the plurality of transform coefficients for the input image block to group the plurality of transform coefficients into the plurality of groups of transform coefficients.
15. The method according to claim 13, wherein
    the entropy coding scheme is a progressive Golomb coding (PGC) scheme, and
    the method further comprises:
        entropy coding, by the encoder circuitry, a group of the plurality of groups of transform coefficients based on the different entropy coding parameter of the PGC scheme.
16. The method according to claim 13, wherein the set of entropy coding schemes comprises a Huffman coding scheme, an exponential-Golomb coding scheme, a Golomb-Rice coding scheme, an arithmetic coding scheme, a Lempel-Ziv-Welch coding scheme, and a progressive Golomb coding (PGC) scheme.

17. The method according to claim 13, further comprising applying, by the encoder circuitry, a transform coding scheme on the input image block,
wherein the transform coding scheme corresponds to one of a one dimensional (1D) row discrete cosine transform (DCT) or a 1D column DCT.

18. The method according to claim 17, wherein the transform coding scheme corresponds to a two dimensional (2D) DCT.

19. The method according to claim 13, further comprising grouping, by the encoder circuitry, one or more transform coefficients of the plurality of transform coefficients into a single group of the plurality of groups of transform coefficients,
wherein the one or more transform coefficients grouped into the single group exhibit a specific pattern in the frequency distribution.

20. The method according to claim 13, wherein a grouping position of the plurality of transform coefficients for the input image block is fixed based on a transform coding scheme applied on the input image block.

\* \* \* \* \*